United States Patent
Kub et al.

(10) Patent No.: US 8,039,301 B2
(45) Date of Patent: Oct. 18, 2011

(54) GATE AFTER DIAMOND TRANSISTOR

(75) Inventors: Francis Kub, Arnold, MD (US); Karl Hobart, Upper Marlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 228 days.

(21) Appl. No.: 12/329,452

(22) Filed: Dec. 5, 2008

(65) Prior Publication Data

US 2009/0146186 A1    Jun. 11, 2009

Related U.S. Application Data

(60) Provisional application No. 60/996,847, filed on Dec. 7, 2007.

(51) Int. Cl.
*H01L 21/00* (2006.01)

(52) U.S. Cl. . 438/105; 438/172; 438/570; 257/E21.041; 257/E21.049; 257/E21.096; 257/E21.107; 257/E21.603

(58) Field of Classification Search .......... 438/105, 438/167, 172, 570; 257/E29.315, E29.317, 257/E21.041, E21.049, E21.096, E21.107, 257/E21.27, E21.603
See application file for complete search history.

(56) References Cited

U.S. PATENT DOCUMENTS

| | | | | |
|---|---|---|---|---|
| 5,278,430 | A  * | 1/1994 | Kakumu | 257/77 |
| 7,067,361 | B2 * | 6/2006 | Allen et al. | 438/167 |
| 2004/0192043 | A1 * | 9/2004 | Makita et al. | 438/689 |
| 2005/0202665 | A1 * | 9/2005 | Namba et al. | 438/607 |
| 2006/0043415 | A1 * | 3/2006 | Okamoto et al. | 257/192 |
| 2006/0174823 | A1 * | 8/2006 | Sung | 117/84 |

\* cited by examiner

*Primary Examiner* — Matthew Landau
*Assistant Examiner* — Colleen E Snow
(74) *Attorney, Agent, or Firm* — Amy L. Ressing; Stephen T. Hunnius

(57) ABSTRACT

A gate after diamond transistor and method of making comprising the steps of depositing a first dielectric layer on a semiconductor substrate, depositing a diamond particle nucleation layer on the first dielectric layer, growing a diamond thin film layer on the first dielectric layer, defining an opening for the gate in the diamond thin film layer, patterning of the diamond thin film layer for a gate metal to first dielectric layer surface, etching the first dielectric layer, depositing and defining a gate metal, and forming a contact window opening in the diamond thin film layer and the first dielectric layer to the ohmic contact.

17 Claims, 6 Drawing Sheets

GATE AFTER DIAMOND TRANSISTOR

This application claims the benefit of U.S. Provisional Application No. 60/996,847 filed Dec. 7, 2007, which is incorporated herein by reference.

The past several years have seen remarkable improvement in GaN-based HEMT technology. Much of this is due to improvements in material growth device design and device fabrication. Despite significant improvements in power added efficiencies, it is becoming increasingly clear that GaN HEMTs designed for RF, microwave and millimeterwave power applications are severely limited by the ability to dissipate heat and thus must run at significantly reduced pulse length and duty cycle. This is somewhat surprising given that the devices are grown on high quality SiC substrates, one of the best thermal conductors available.

Recent thermal simulations indicate that the substrate is not the primary source of the thermal impedance, rather it is the ability of the GaN to locally spread the heat to the surrounding material and substrate due to the extraordinarily high power dissipation density in the near-channel device region (estimated at many megawatts) and the strong reduction in thermal conductivity with increasing temperature. Integrating the capability to locally spread the thermal power dissipated near the channel will have a large impact on overall device performance and allow significant total power output improvements.

One approach that has previously been investigated to improve the lateral heat spreading in the active device regions is the diamond after gate process. The major disadvantage of a 'diamond after gate' process is that the diamond deposition temperature must be sufficiently low (<400 C) to prevent degradation of the Schottky gate (i.e., lowering of the Schottky barrier height) and thus an increase gate leakage. The diamond film deposited at low temperatures contains non negligible sp2-bonded carbon, or graphite, which significantly degrades the thermal conductivity as well as degrades the resistivity of the diamond film. A high resistivity diamond film is required in the transistor active region in order to not increase the transistor microwave losses. Third, in order to implement a fully or near back-end-of-the-line process, other process modifications, such as necessary intermediate dielectrics, must be made in order to protect the GaN/AlGaN material. Such modifications may undermine any improvements in thermal conductivity gained by the addition of diamond. This trade-off of diamond quality and transistor gate leakage current can be avoided if one considers a process that integrates the diamond deposition process before the Schottky gate metal deposition.

A device structure and method to integrate a diamond thin film layer into a GaN Field Effect Transistor (FET) process and more specifically, a AlGaN/GaN HEMT (High Electron Mobility Transistor) process, utilizing a novel 'gate-after-diamond' process is disclosed. The diamond thin film layer will act to improve lateral heat spreading locally in and near the active region of power dense microwave and millimeterwave devices. The lateral heat spreading will increase the area for vertical heat transfer to the substrate. In addition, the lateral heat spreading can transfer the heat to thermal shunts built into the substrate. The diamond layer can additionally form the dielectric beneath a Source Field Plate or a Gate Field plate device structure. The Field Plate structure can reduce the peak electric field in the gate-to-drain region to increase the breakdown voltage of the transistor.

With the device and process of the current disclosure, the metal used for the transistor Schottky gate is not subjected to the high process temperatures required for the diamond depositions as is the case for 'diamond after gate' process. Because of the lateral heat spreading enabled by the diamond thin film, there is reduced peak channel temperature and improved transistor reliability. The current device and process provides for improved AlGaN/GaN HEMT pulse length and duty cycle as well as increased total RF, microwave and millimeterwave output power and gain.

The typical epitaxial layer structure for a AlGaN/GaN HEMT consists of an AlGaN epitaxial layer grown on a GaN epitaxial layer that is optionally grown on an AlN nucleation layer on a sapphire substrate, a SiC substrate, or a GaN substrate. Because of the spontaneous and piezoelectric polarization in the AlGaN layer, a two-dimensional electron gas with a high carrier density is formed at the interface of the AlGaN layer and the GaN layer. There are other variations of the epitaxial layer structure that are sometime used for AlGaN/GaN HEMTs. One variation is to use a thin GaN cap layer on the surface of the AlGaN layer. The thin GaN cap layer has improved passivation properties compared to the AlGaN surface and can help prevent cracking of the AlGaN layer. Another variation is to use an InAlN layer in place of the AlGaN layer. One advantage of the InAlN layer can be lattice matched to the GaN layer and has a high potential offset from the conduction band minimum of the GaN material. There are other epitaxial layer arrangements that can include the use of InGaN back barrier, or channel layer and AlGaN back barrier.

As disclosed herein, several aspects for the 'gate-after-diamond' GaN FET process include the first dielectric layer on AlGaN or GaN surface to protect and passivate the AlGaN or GaN surface, the Schottky gate metal formed after patterning of the diamond layer by subtractive etch of diamond to pattern the diamond layer or selective growth of diamond to pattern the diamond layer, the optional 'gate field plate' and 'source field plate' implementations and the 'Gate after diamond' GaN FET process without first dielectric layer.

This technology can be applied to other transistor technologies such as InGaAs/GaAs psuedomorphic HEMT transistor technology, SiC MESFET technology, InP Heterojunction bipolar transistor technology, GaAs and GaN Laser diode technology.

Figure 1:
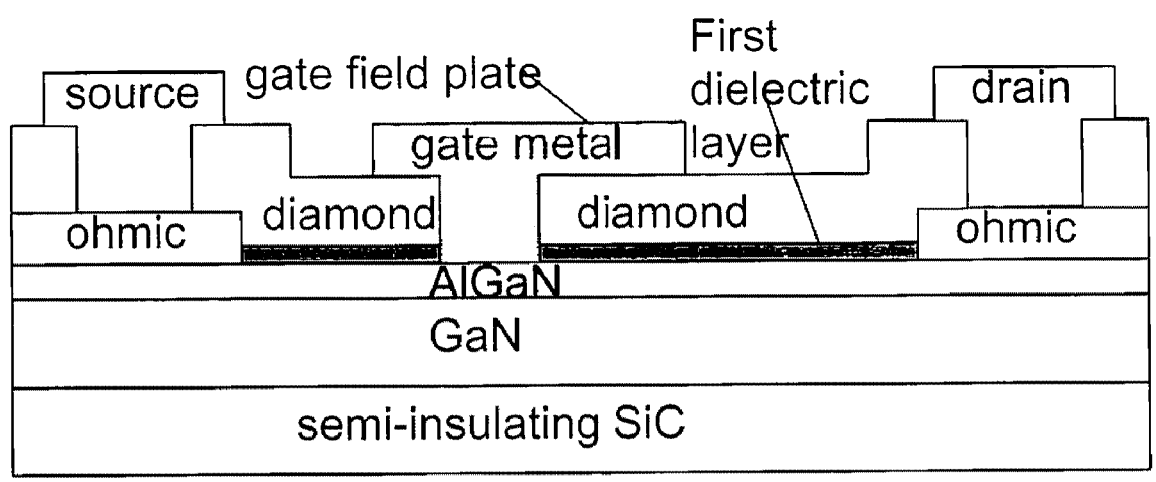
FIG. 1 discloses a cross section of 'gate after diamond' AlGaN/GaN HEMT.
Figure 2:
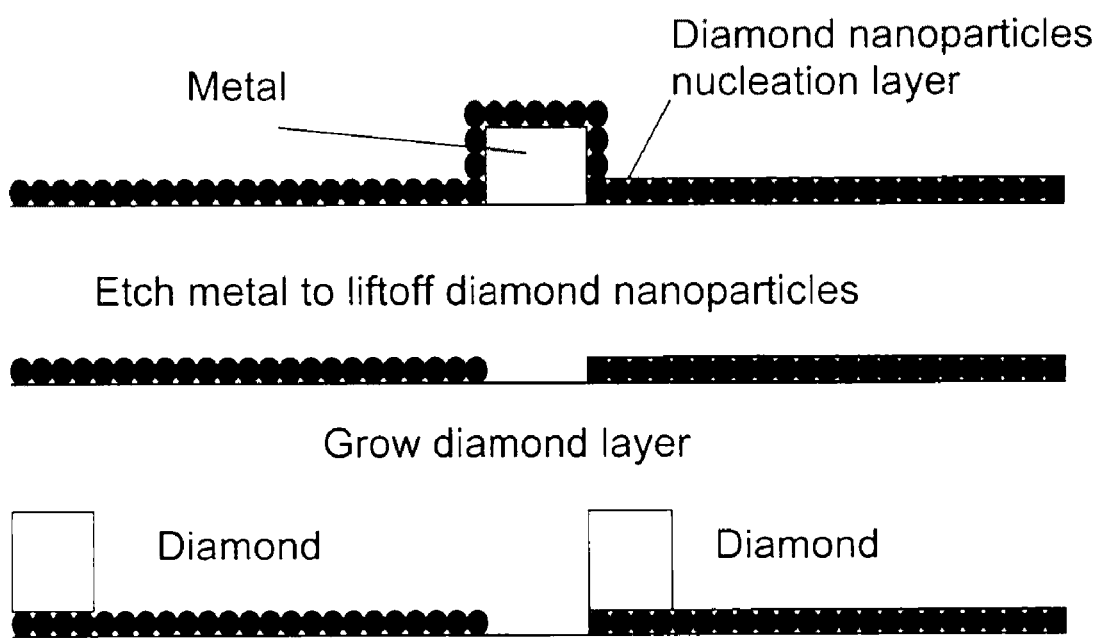
FIG. 2 discloses a metal lift-off approach for selective diamond growth.
Figure 3:
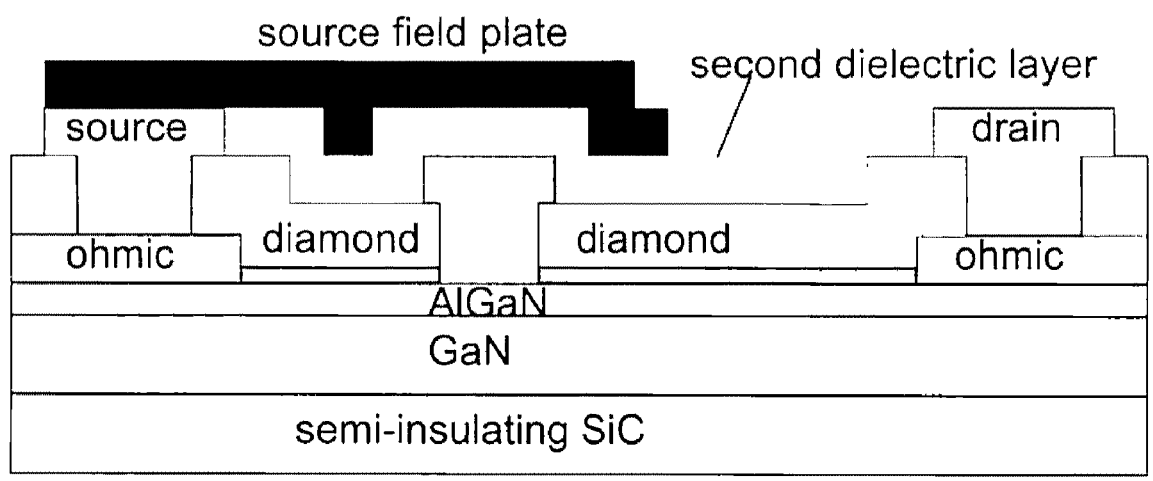
FIG. 3 discloses a cross section of 'gate after diamond' AlGaN/GaN HEMT with a Source Field Plate.
Figure 4:
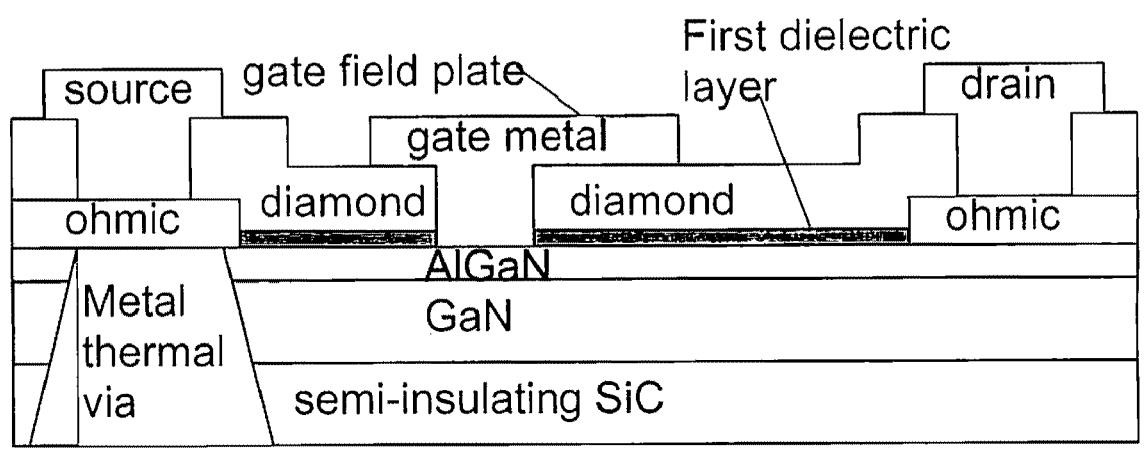
FIG. 4 a cross section of 'gate after diamond' AlGaN/GaN HEMT with a metal filled thermal via to conduct heat to the backside of the device.
Figure 5:
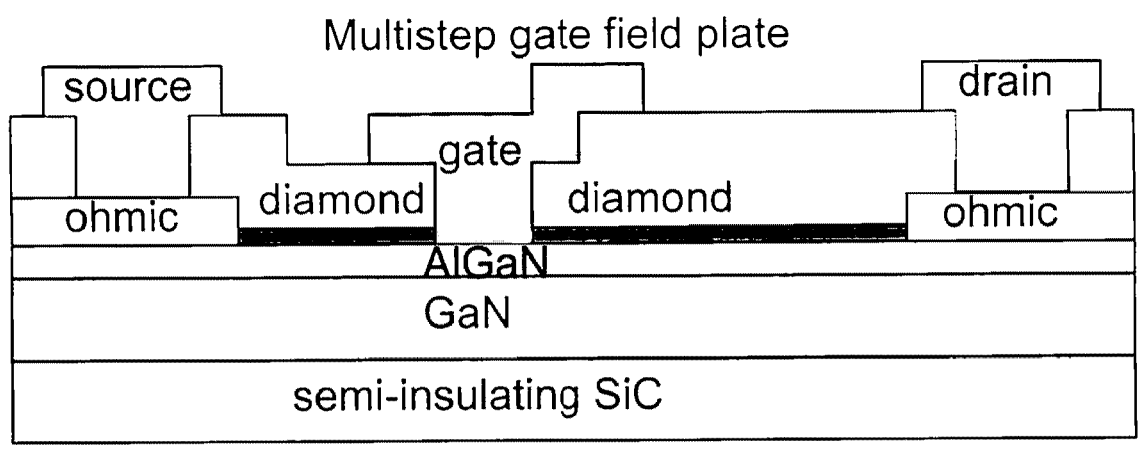
FIG. 5 discloses a cross section of 'gate after diamond' AlGaN/GaN HEMT with a multi-step gate field plate.
Figure 6:
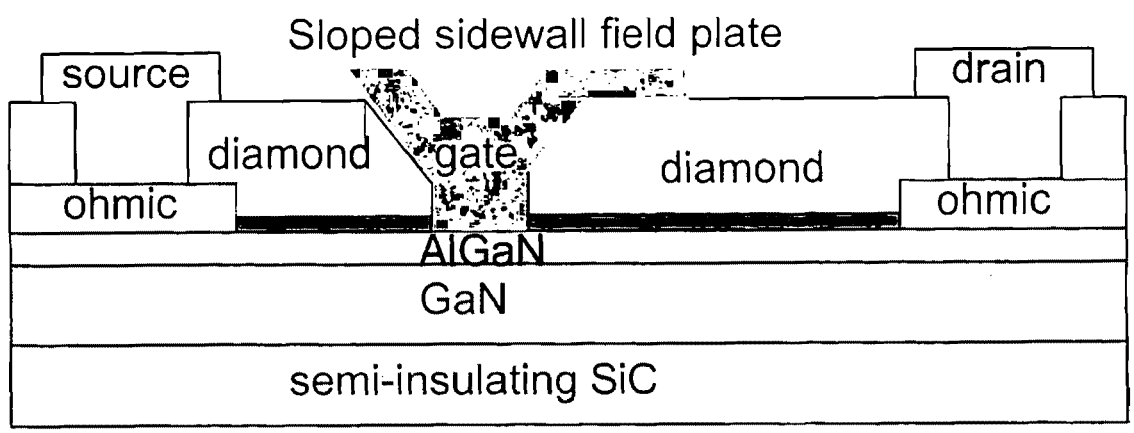
FIG. 6 discloses a cross section of 'gate after diamond' AlGaN/GaN HEMT with a sloped sidewall gate field plate.

One embodiment of the 'gate-after-diamond' GaN FET process is disclosed as shown in FIG. 1. In this process, the GaN/AlGaN layers are grown (with an optional thin GaN cap layer), typically by MOCVD or MBE. Optionally, an in-situ dielectric layer (typically in-situ silicon nitride layer but can also be silicon oxide layer and/or metal oxide layer) can be grown while the substrate is within the MOCVD or MBE growth system. One advantage of an in-situ dielectric layer is that the AlGaN/GaN surface is not exposed to an oxidizing ambient so that an AlGaN or GaN surface can be passivated with an in-situ grown dielectric layer without a need to remove a native oxide layer. The next step in a AlGaN/GaN HEMT process is typically to perform a device isolation process typically implemented by a mesa etch process (the device isolation process can be performed by mesa etch at this step in the process, however, there are alternate methods of forming the device isolation such as ion implantation later in the process.)

The source/drain ohmic contacts are then formed using conventional photolithography, metal deposition, and anneal. If the in-situ dielectric layer is sufficiently thin, the ohmic metal alloy will spike through the thin in-situ dielectric layer and it will not be necessary to form a contact window photo-step to make an opening in the in-situ dielectric layer for direct ohmic metal to AlGaN or GaN contact.

The next step is appropriate cleaning of the AlGaN or GaN surface and then an optional step for a plasma nitrogen step to react nitrogen with the AlGaN or GaN surface to minimize nitrogen vacancies at the AlGaN or GaN surface and an optional anneal step in a nitrogen environment.

Another step in the 'gate-after-diamond' process is that a first dielectric layer be deposited that protects and passivates the AlGaN or GaN surface during the diamond nucleation layer deposition, diamond thin film layer growth, and diamond etch steps.

The first dielectric layer can consist of an in-situ grown dielectric layer (or layers), a combination of an in-situ grown dielectric layer (or layers) and an ex-situ grown dielectric layer (or layers) (ex-situ means deposited in a system other then the original AlGaN/GaN growth system), or an ex-situ grown dielectric layer (or layers). The first dielectric layer can be a composite dielectric layer consisting of one or more dielectric layers on the AlGaN or GaN surface grown using either in-situ or ex-situ growth techniques. In-situ and ex-situ dielectric layers will typically be from the group of silicon nitride, silicon oxide, or metal oxide with typical metal oxide layers being such thin film layers as Al2O3. HfO, lanthanium oxide, Gd2O3, or Sc2O3, or a composite dielectric consisting of combination of silicon nitride, silicon oxide and/or metal oxide. The in-situ grown dielectric layers will typically be grown by a chemical vapor deposition (CVD), metal organic chemical vapor deposition (MOCVD), molecular beam Epitaxy (MBE) or plasma deposition technique. The ex-situ dielectric approach include all of the commonly known thin film growth techniques but can also include new growth techniques such atomic layer deposition.

An example of a candidate first dielectric layer would be a 1 nm thick in-situ grown silicon nitride layer followed by the deposition of an ex-situ 3 nm thick Al2O3 layer formed by an Atomic Layer Deposition process. In the case that an in-situ silicon nitride layer is not used, it can be desirable to expose the AlGaN or GaN surface to a nitrogen plasma to react nitrogen with the AlGaN or GaN surface to reduce the number of nitrogen vacancies at the surface prior to the deposition of the ex-situ dielectric layer.

The first dielectric layer can provide a number of benefits. These benefits can include that it passivates the GaN (or AlGaN) surface to achieve low interface state density or the preferred fixed charge in the dielectric. This thin dielectric film can typically be a silicon nitride deposited layer but can be an Al2O3 deposited layer. HfO deposited layer, other metal oxide deposited layer or combination of preceding layers. The best surface passivation of GaN is typically obtained for silicon nitride layer deposited directly on GaN or AlGaN or AlN surface.

The first dielectric layer can act as an etch stop layer for selective diamond etching. The diamond film will typically be etched by an oxygen reactive ion etch process. Thus, material layers such a silicon nitride, silicon oxide, hafnium oxide, aluminum oxide, etc. can act as an etch stop layer. There is the distinct possibility that in the GaN (or AlGaN) surface were exposed to an oxygen RIE etch, that the surface of the GaN (or AlGaN) will be damaged which would degrade a Schottky gate formed in the region of the RIE.

The first dielectric layer can act as an insulating gate dielectric layer beneath a metal gate. It can protect the GaN or AlGaN surface mechanical from damage during the diamond deposition process. The diamond deposition process typically uses the ultrasonic deposition of nanocrystalline diamond particles that act as a nucleation layer for diamond growth. The diamond particles accelerated by ultrasonic energy can collide with the GaN surface causing mechanical damage. Furthermore, it can protect the AlGaN or GaN surface from chemical decomposition during the growth of the diamond film. The growth environment for diamond typically include CH4/H2 gas mixture and these gases can decompose the GaN surface at typical diamond growth temperatures. A thin layer of silicon nitride or other dielectric material can protect the GaN surface during diamond growth.

The first dielectric thin film layer should be optimized for the capability to have a low surface state density, low hot electron carrier trapping, high dielectric field strength, and be sufficiently thin so that the thermal impedance to the diamond heat spreading layer is low. An optional anneal at approximately 600 C can be performed to increase the dielectric strength of the ex-situ deposited first dielectric layer.

The next step is to deposit a diamond nucleation layer, deposit a diamond film layer, and define openings in the diamond layer in which gate metal will be deposited. There are two primary approaches to defining the opening in diamond layer: 1) Selective growth of the diamond layer and 2) RIE etch of opening in the diamond layer.

The selective diamond approach uses the experimental observation that diamond typically only nucleates on diamond particles (or diamond nanocrystalline particles). The approach for selective growth is thus to define regions where the diamond nanoparticles are removed. There are several approaches to remove the diamond nanoparticles. The most straight forward is to use conventional photolithography and RIE to remove diamond nanoparticles in regions where an opening in the diamond layer is desired. An alternate approach is to photolithography define a metal or polymer patterned layer by lift off or subtractive etch process. Diamond nanoparticles are then deposited over the metal or polymer patterned layer. The metal or polymer are then etched to lift off the diamond nanoparticles over top of the metal or polymer. A diamond layer is then grown such that the diamond nucleates on the diamond nanoparticles, forming an opening in the diamond layer.

For a second approach of patterning the diamond thin film layer by subtractive etching, a layer of diamond nucleation particles (preferably nanocrystalline diamond particles) is deposited on the surface of the first dielectric layer and ohmic metal layer to form a diamond particle nucleation layer. The diamond film with thickness in the range of 100 nm to 5 um is then grown by growth of the diamond film on the diamond particle nucleation layer. The diamond film is typically grown in an atmosphere of a carbon containing precursor (methane, propane, etc), hydrogen, and inert gases such as argon by a plasma deposition process deposition or thermal filament process. A photolithography process is then performed to define the region where the diamond will be etched to the surface of the first dielectric layer and/or alternately to the GaN or AlGaN surface. The photolithography pattern will define the region for etching of the diamond where the gate metal will be formed. The RIE etching of the diamond will typically be by oxygen RIE (or a RIE process that includes oxygen or fluorine).

The resist for the RIE etching can be UV hardened to increase the resistance to oxygen RIE etching of the resist. Alternately, a hard mask composed of a thin film material such as metal, oxides ($SiO_2$ or metal oxides such as $Al_2O_3$), silicon nitride ($Si_3N_4$) or amorphous silicon or polycrystalline silicon can be defined by the photolithography step and then the hard mask can be used as the mask layer for the oxygen RIE etch. The thin first dielectric layer can act as an etch stop for the diamond RIE etch. Next, the first dielectric layer will typically be etched to the AlGaN or GaN surface (Alternately, the first dielectric layer can be left unetched and in this case, the first dielectric layer can be used as a gate insulator dielectric layer). For the case that the RIE etch is performed to the AlGaN or GaN surface, a clean and/or etch step is preformed to clean the surface prior to the Schottky gate metal deposition. A typical clean/etch solution is $NH_4OH$. Other process steps that can be used to prepare the surface for Schottky gate metal deposition exposing the surface to a nitrogen plasma or an anneal in a nitrogen ambient. Optionally, a thin second dielectric layer can be deposited (by atomic layer deposition or by CVD or plasma process) within the etched opening in the diamond layer and on the surface of the AlGaN or GaN (or alternately the surface of the first dielectric layer) before the Schottky gate metal deposition step. This thin second dielectric layer can perform the function of gate insulator dielectric. In one preferred design, the Schottky gate metal is defined to extend beyond the diamond thin film layer and it thus overlaps the diamond thin film layer. This design can be used to implement a gate field plate. An alternate design is to define the Schottky gate to reside within the opening in the diamond thin film layer and not overlap the diamond layer. An advantage of the second design is reduced gate-to-drain capacitance and reduced gate-to-source capacitance for high frequency operation.

Another option that is sometimes used for AlGaN/GaN HEMT devices is to etch a recess through a GaN cap layer and/or part of the way through the AlGaN layer. The etching of a recess through the GaN cap layer allows a reduction of the source and drain resistance. The advantage of the recess etch into the AlGaN layer is to change the threshold voltage of the device. One approach of implementing a normally-off transistor is to etch a recess completely through the AlGaN layer. The typical design for an AlGaN/GaN HEMT transistor with a recess is to first etch the recess and then define the Schottky gate to be placed within the recess without the Schottky gate metal contacting the edges of the recess. To implement this design for the gate-after-diamond would be to etch the diamond layer to the first dielectric layer, etch the first dielectric layer to the semiconductor GaN or AlGaN surface, etching a recess through the GaN and/or AlGaN layer, optionally depositing a dielectric layer, and then defining the Schottky gate to reside within the recess opening. A second design would be to etch the diamond layer to the first dielectric layer, etch the first dielectric layer to the semiconductor GaN or AlGaN surface, etch a recess through the GaN and/or AlGaN layer, optionally deposit a dielectric layer, and then defining the Schottky gate metal such that it overlaps the diamond thin film layer and recess layer.

Prior to depositing the gate metal, contact windows for ohmic metal can be etched, ohmic metal deposited, and anneal if ohmic contact have not been performed in a previous step. There is also the option of forming contact windows through the diamond layer to ohmic metal if the contact windows were not formed during the diamond etch for defining the gate pattern.

The gate metal (Schottky gate metal if metal is in direct contact with the semiconductor) is next deposited and defined. For the case that a 'gate field plate' is formed, the gate metal will be overlap the RIE etched opening in the diamond film on both sides of the opening, but typically overlap to a greater extent on the drain side. The purpose of the gate field plate is to reduce the peak electric field and increase the breakdown voltage. The thickness of the diamond can be selected to achieve a minimum in the peak electric field. While it is desirable to have a thick diamond layer from lateral thermal conductivity considerations, a thick diamond layer can reduce the effectiveness of the gate field plate in reducing the electric field. A candidate diamond thickness where the gate field plate is effective in reducing the peak electric field but thick enough to achieve lateral conduction of generated heat is approximately 700 nm thick.

The slope of the side walls for a portion (or entire sidewall) of the etched opening in the diamond in which the gate metal will be deposited when implemented with the Gate Field Plate process can be optimized for increasing the breakdown voltage and improving the transistor high frequency performance. A sloped side wall on the etch opening in the diamond will aid in reducing the peak electric field beneath the gate field plate. The larger the slope is from perpendicular to the AlGaN surface, the larger the reduction in peak electric field beneath the Gate Field Plate. One example of a process to form a sloped side for a portion of the side wall is to use a isotropic plasma etch for a portion of the diamond etch followed by an RIE etch to the first dielectric layer surface.

A multi-step gate field plate can also be implemented to achieve a thicker diamond layer for lateral heat conduction and high breakdown field. In this case, a two step diamond etch process is performed. The first photodefined diamond etch process etches part way though the diamond layer and the second photodefined etch process etches to the surface of the first dielectric layer with the second photodefined region having a smaller width and residing within the first photodefine region. A photodefined gate metal can then formed to overlap both steps in the diamond layer forming a multi-step gate field plate.

A self-align process can also be used to form the Schottky metal gate. In this case, the resist that is used to define the gate opening can also be used as a lift-off layer for the gate Schottky metal. A T-gate Schottky metal can be formed using a lift-off approach. For the case that a 'Source Field Plate' is formed, the process would be to deposit a dielectric layer after the gate metal formation and then deposit and define the metal for the 'Source Field Plate'.

A multistep Source Field Plate can be formed in the same manner as described for the multi-step Gate Field Plate by performing the first diamond etch part way through the film and later depositing the insulating dielectric over the gate metal and diamond layer.

The opening in the diamond layer over the ohmic contacts can be formed at the same times as the opening in the diamond for the Schottky gate formation. Alternately, the opening in the diamond layer to the ohmic contact but can also be formed in a separate photostep and etching process. Following Schottky gate metal fabrication, thick contact metal would sandwich the diamond between the S/D ohmics and the thick Au overlayer to improve lateral heat dissipation away from the gate-drain area.

The deposited diamond layer can improve the lateral thermal conduction of heat that is generated in the area of the gate, source, and drain to help spread the heat to a larger area where the heat can be conducted vertically through the substrate to additional material layers on the backside of the substrate that can further help conduct heat away from the device. The AlN/GaN and AlGaN layers for a GaN FET will typically be grown on a SiC substrate, a GaN substrate, sapphire substrate, an AlN substrate, or a AlGaN substrate. The SiC substrate will typically have a thermal conductivity of >300 W/mK and the GaN substrate can have a thermal conductivity of ≈150 to 180 W/mK. The lateral heat spreading of the diamond layer will increase the area for thermal conduction of the heat and thus reduce the thermal impedance for heat conduction.

There is an optional approach of forming thermal shunts in the substrate or to flip chip bonded metal post joints to obtain reduced thermal impedance for conducting the heat away from the active area of the device. The thermal shunts in the substrate are ideally metal filled and conduct the heat vertically to the backside of the substrate where the heat is then transported to additional material layers. The thermal shunts in the substrate can be arranged so that they either make electrical contact to the source or do not electrical contact the active device region. The metal filled vias do not necessarily have to perform an electrical function, but they can in some cases be arranged to provide low inductance ground contact to the source of the GaN FET.

In the preferred implementation, the resistivity of the nanocrystalline diamond layer is selected to be insulating. Alternately, the resistivity of the diamond thin film layer can be selected to be semi-insulating. An advantage of a semi-insulating diamond thin film is that it will be able to conduct charge that is injected into the layer to prevent the build up of charge regions that can create locations of high electric field that can cause lower breakdown voltage for the device. In addition, a semi-resistive diamond thin film layer can help to reduce the peak electric field by which will lead to a higher breakdown voltage.

An alternate process for fabricating a 'gate-after-diamond' AlGaN/GaN HEMT is to process the device structure so that the diamond nucleation particles are directly on the AlGaN or GaN surface without a first dielectric layer.

For this process, it is desirable to expose the AlGaN or GaN surface to a nitrogen plasma to react nitrogen with the AlGaN or GaN surface to try to minimize the number of nitrogen vacancies at the AlGaN or GaN surface prior to the deposition of the diamond particle nucleation layer. Some advantages of a process without a first dielectric layer is that the diamond is in direct contact with the AlGaN surface to achieve the maximum thermal conductivity. There are a number of disadvantages to the process that does not use a first dielectric layer. The diamond particle nucleation layer is deposited using ultrasonic agitation. There is a possibility that the GaN surface can be damaged by the energy of the impacting diamond nanoparticles. The diamond growth gas environment can cause the GaN surface to decompose. In addition, the surface state density and fixed oxide charge may not be as low as is the case for a first dielectric layer directly deposited on the AlGaN/GaN surface.

For the above mentioned reasons, it is desirable to utilize a process in which a first dielectric layer is deposited on the AlGaN (or GaN) prior to the deposition of the diamond layer.

Example Process: Outline of Process Steps to Fabricate 'Gate-After-Diamond' AlGaN/GaN HEMT 1. Grow AlGaN and GaN epitaxial layers by MOCVD or MBE.
2. Optionally grow in situ silicon nitride layer (range of thickness of 0.2 nm to 100 nm)
3. Source/drain ohmic contact formation
4. Mesa isolation by etching
5. Clean followed by optional plasma nitrogen
6. Ex-situ deposit a dielectric layer consisting of $Al_2O_3$, HfO, $Gd_2O_3$, $Sc_2O_3$, Silicon Nitride, Silicon Oxide, other metal oxide layer or combination of dielectric material layers.
7. Deposit diamond particle nucleation layer (preferably nanocrystalline diamond nucleation layer.)
8. Grow diamond thin film layer
9. Photolithography to define gate opening (an optional process would be to form contact windows to ohmic metal during this photostep process as well)
10. Patterning of diamond thin film layer for gate metal to first dielectric layer surface either by subtractive etch of diamond or selective growth of diamond
11. Etch first dielectric layer to AlGaN or GaN surface
12. Clean and/or plasma nitrogen and/or thin dielectric layer deposition
13. Optional step: Note that it also possible form etch contact windows through the diamond thin film layer to AlGaN/GaN surface, deposit ohmic metal, and anneal to form ohmic metal contact
14. Deposit and define gate metal (Schottky gate metal if metal in direct contact with semiconductor)
15. Optional device isolation by etching or implant (if not performed at an earlier step)
16. Form contact window openings in diamond and first dielectric layer to the ohmic metals (if not previously formed during patterning of opening in diamond for gate metal.
17. Deposit and define thick metal.

Obviously many modifications and variations of the present invention are possible in light of the above teachings. It is therefore to be understood that the claimed invention may be practiced otherwise than as specifically described. Any reference to claim elements in the singular. e.g., using the articles "a," "an," "the," or "said" is not construed as limiting the element to the singular.

What is claimed is:

1. A method of making a transistor comprising the steps of:
depositing a first dielectric layer on a semiconductor substrate;
depositing a diamond particle nucleation layer on the first dielectric layer;
growing a diamond thin film layer on the first dielectric layer;
defining an opening for the gate in the diamond thin film layer;
patterning the diamond thin film layer for a gate metal to the first dielectric layer surface;
etching the first dielectric layer to the semiconductor substrate;
depositing a gate metal on the semiconductor substrate;
performing a device isolation process by etching or implanting; and
forming a contact window opening in the diamond thin film layer and the first dielectric layer to an ohmic contact;
wherein the step of performing a device isolation process by etching or implanting is performed after the step of depositing and defining a gate metal.

2. The method of claim 1 further comprising the step of growing in situ the first dielectric layer having a thickness of from about 0.2 nm to about 100 nm wherein said first dielectric layer is selected from the group consisting of silicon nitride, silicon oxide, and metal oxide while growing an AlGaN and an GaN epitaxial layer on the SiC substrate.

3. The method of claim 1 wherein the semiconductor substrate is formed by the steps of:
growing a AlGaN and a GaN epitaxial layer on a SiC substrate;
forming a source/drain ohmic contact on the AlGaN layer; and
performing a device isolation process; and
wherein the method of making a transistor further includes the step of depositing a thick metal on the gate metal on the source/drain ohmic contact.

4. The method of claim 3 wherein said step of growing a AlGaN and a GaN epitaxial layer on a SiC substrate is by MOCVD or MBE.

5. The method of claim 4 wherein said step of performing a device isolation is by a mesa etch process.

6. The method of claim 3 wherein said step of forming a source/drain ohmic contact is by one selected from the group consisting of photolithography, metal deposition and anneal.

7. The method of claim 1 further including the step of processing with nitrogen plasma after the step of performing a device isolation process to react nitrogen with an AlGaN or GaN surface and including the step of processing with nitrogen plasma after the step of etching the first dielectric layer.

8. The method of claim 1 wherein said first dielectric layer is one selected from the group consisting of $Al_2O_3$, HfO, Gd2O3, Sc2O3, Silicon Nitride, Silicon Oxide, metal oxide layer and combinations thereof.

9. The method of claim 1 wherein the diamond particle nucleation layer on the first dielectric layer is a nanocrystalline diamond nucleation layer.

10. The method of claim 1 wherein a contact window to ohmic metal is formed during the step of defining a gate opening in the diamond thin film layer by photolithography.

11. The method of claim 1 wherein said step of defining a gate opening in the diamond thin film layer is by selective growth of the diamond thin film layer or RIE etch opening in the diamond thin film layer.

12. The method of claim 1 wherein said step of patterning of the diamond thin film layer for gate metal to first dielectric layer surface is performed by subtractive etch of diamond or selective growth of diamond.

13. The method of claim 12 wherein the metal gate overlaps the diamond thin film layer.

14. The method of claim 1 further including the step of depositing a second thin dielectric layer after said step of etching the first dielectric layer to the semiconductor substrate.

15. The method of claim 1 wherein an ohmic metal contact is formed by etching a contact window through the diamond thin film layer to AlGaN/GaN surface, depositing an ohmic metal, and annealing to form an ohmic metal contact.

16. The method of claim 1 wherein the gate metal is a Schottky gate metal.

17. The method of claim 1 further including the step of creating a recess in the semiconductor substrate.

* * * * *